US005252956A

United States Patent [19]

Senn et al.

[11] Patent Number: 5,252,956

[45] Date of Patent: Oct. 12, 1993

[54] SAMPLE AND HOLD CIRCUIT FOR A LIQUID CRYSTAL DISPLAY SCREEN

[75] Inventors: Patrice Senn; Alan Lelah, both of Grenoble; Gilbert Martel, Meylan, all of France

[73] Assignee: France Telecom Etablissement Autonome de Droit Public (Center National D'Etudes des Telecommunications), Moulineaux, France

[21] Appl. No.: 764,196

[22] Filed: Sep. 23, 1991

[30] Foreign Application Priority Data

Sep. 21, 1990 [FR] France ............................... 90 11682

[51] Int. Cl.[5] ......................... G09G 3/36; G09G 3/00; H03K 5/159

[52] U.S. Cl. .................................... 345/100; 340/805; 307/353

[58] Field of Search ................ 307/353; 340/719, 784, 340/793, 802, 805, 811

[56] References Cited

U.S. PATENT DOCUMENTS

| | | | |
|---|---|---|---|
| 4,578,646 | 3/1986 | Maio et al. | 307/353 |
| 4,763,088 | 8/1988 | Negahban-Hagh | 307/353 |
| 4,781,437 | 11/1988 | Shields et al. . | |
| 4,799,057 | 1/1989 | Takeda et al. | 340/784 |
| 4,823,027 | 4/1989 | Takahashi | 307/353 |
| 4,978,872 | 12/1990 | Morse et al. | 307/353 |
| 5,017,914 | 5/1991 | Uchida et al. | 340/811 |

FOREIGN PATENT DOCUMENTS

| | | |
|---|---|---|
| 3641556 | 12/1986 | Fed. Rep. of Germany . |
| 2159657 | 12/1985 | United Kingdom . |

*Primary Examiner*—Alvin E. Oberley
*Assistant Examiner*—Steve Saras
*Attorney, Agent, or Firm*—Oblon, Spivak, McClelland, Maier & Neustadt

[57] ABSTRACT

Sample and hold circuit for a liquid crystal display screen. The circuit comprises two stages, the first with switched capacitance the second with an amplifier device. Application to the control of liquid crystal display screens.

2 Claims, 4 Drawing Sheets

SAMPLE AND HOLD CIRCUIT FOR A LIQUID CRYSTAL DISPLAY SCREEN

BACKGROUND OF THE INVENTION

1. Field of the Invention

This invention has as its object a sample and hold circuit for a liquid crystal display screen.

2. Discussion of the Background

A liquid crystal display screen is generally in the form illustrated in FIG. 1. The screen itself, ECR, consists of addressing lines L and columns C, of a matrix of pixels P, each connected to a transistor TFT whose state is controlled by an associated line L and column C.

Such a screen is controlled by a line control circuit CCL, which sequentially applies an addressing voltage (for example, several volts) to the lines, and by a column control circuit CCC, which applies to all the columns voltages reflecting the light intensity of the points to be displayed on the addressed line. The overall image is thus displayed line by line.

Column control circuit CCC receives a video signal SV delivered by a video circuit CV. This signal generally consists of three components corresponding to the three primary components of a color image.

If screen ECR has 162 columns, circuit CCC comprises 162 elementary column control circuits, placed in parallel, and 162 outputs connected to various columns. Each elementary column control circuit (also called "driver column" in the technical literature) comprises a sample and hold circuit whose function is to sample the video signal at a given moment corresponding to the column to be controlled and to hold this sample on the column for the entire addressing period of a line ("sample and hold" function in English terminology).

This invention relates to such a sample and hold circuit.

The production of a sample and hold circuit for a liquid crystal display screen poses many problems.

First of all, it should allow the sampling of the video signal relative to a line while the signals relative to the preceding line are applied on the columns.

Further, if it is desired to be able to supply a large-sized display screen having a high number of columns (more than a hundred), a circuit of very low electrical consumption and exhibiting a short loading period for a high capacitive load is required.

Finally, it is desirable that the structure of the circuit makes it possible to compensate the offset voltages caused by the amplification and the shaping of the video signals.

The sample and hold circuits of the prior art present all the drawbacks. Thus, in the circuit marketed by the HITACHI Company under reference HD 66300T, for example, four sample and hold circuits per column, working alternately, are used. The circuit thus contains 480 sample and hold circuits for a 120 column screen. The electrical consumption is therefore very great. Further, in such a structure, it is not possible to correct the offset voltage.

Display screen control circuits comprising a first sampling stage consisting of a sampling capacitor and a second stage comprising a holding capacitor are known by documents EP-A-0 381 429 and GB-2 146 479. In this type of circuit, it is necessary to transfer the load of the first capacitor to the second and the output signal consists of the voltage present at the terminals of the second capacitor. To avoid degrading the signal, a first (sampling) capacitor with a much larger capacitance than that of the second (holding) capacitor is necessary. The loading time of the first capacitor is increased however, due to its relatively large size. Further, since the output voltage is linked to the input voltage by a ratio $C1/C1+C2$ (where C1 and C2 are the capacitances of the first and second capacitors), at best, the output voltage is equal to the input voltage. Further, the large value of the first capacitor leads to an excessive bulkiness and seriously limits the integration possibilities of the circuit. Finally, the load impedance of the video amplifiers is considerably increased.

Further, another solution which avoids the use of a holding capacitor (cf. FIG. 11 of this document) is known by document FR-A-2 458 117. This solution consists in using two identical sampling paths mounted in parallel and working alternately. However, in this solution, the gain of the circuit is limited to 1 and doubling of the number of paths naturally increases the bulkiness of the circuit.

SUMMARY OF THE INVENTION

This invention has as its object to remedy the above noted drawbacks. For this purpose, it proposes a sample and hold circuit of low power consumption (less than 50 microamperes, nonoperated) exhibiting a short loading time (the circuit is capable of loading an outside capacitance of 150 pF per 6 V in 2 microseconds) and its output dynamics are close to the difference of polarization voltages ($V_{DD}-V_{SS}$) (actually slightly less than this value, or approximately $V_{DD}-V_{SS}-0.3$ V). Finally, by adding a single capacitor, it is possible to correct the offset voltage easily.

For this purpose, the invention proposes a sample and hold circuit of the type of those which comprise:

- a first sampling stage connected to an input receiving a video signal relative to each line to be controlled,
- a second holding stage with an output which can be connected to a column of the screen,
- means:
  - to control the sampling relative to a line in the first stage,
  - to control at the same time the holding in the second stage of the sample corresponding to the preceding line,
  - then to transfer the sample from the first stage into the second, wherein:

- the first stage comprises a first sampling capacitor connected to the video input through first electronic switches,
- the second stage comprises an amplifier with a nonreversing input, a reversing input and an output, the output being looped on the reversing input by a second storage capacitor, a second electronic switch being placed in parallel with the second capacitor, the inputs of the amplifier being connected to the first sampling capacitor by third electronic switches.

Preferably, an offset correction capacitor is connected to the first sampling capacitor to correct the offset produced by the amplifier located downstream. This capacitor operates during the time when the sampled signal is transferred from the first stage to the second stage.

BRIEF DESCRIPTION OF THE DRAWINGS

The characteristics and advantages of the invention will be understood better in the light of the following description. This description relates to embodiments given by way of explanatory and not at all limiting examples. It refers to accompanying drawings, in which.

DETAILED DESCRIPTION OF THE PREFERRED EMBODIMENTS

Figure 1:
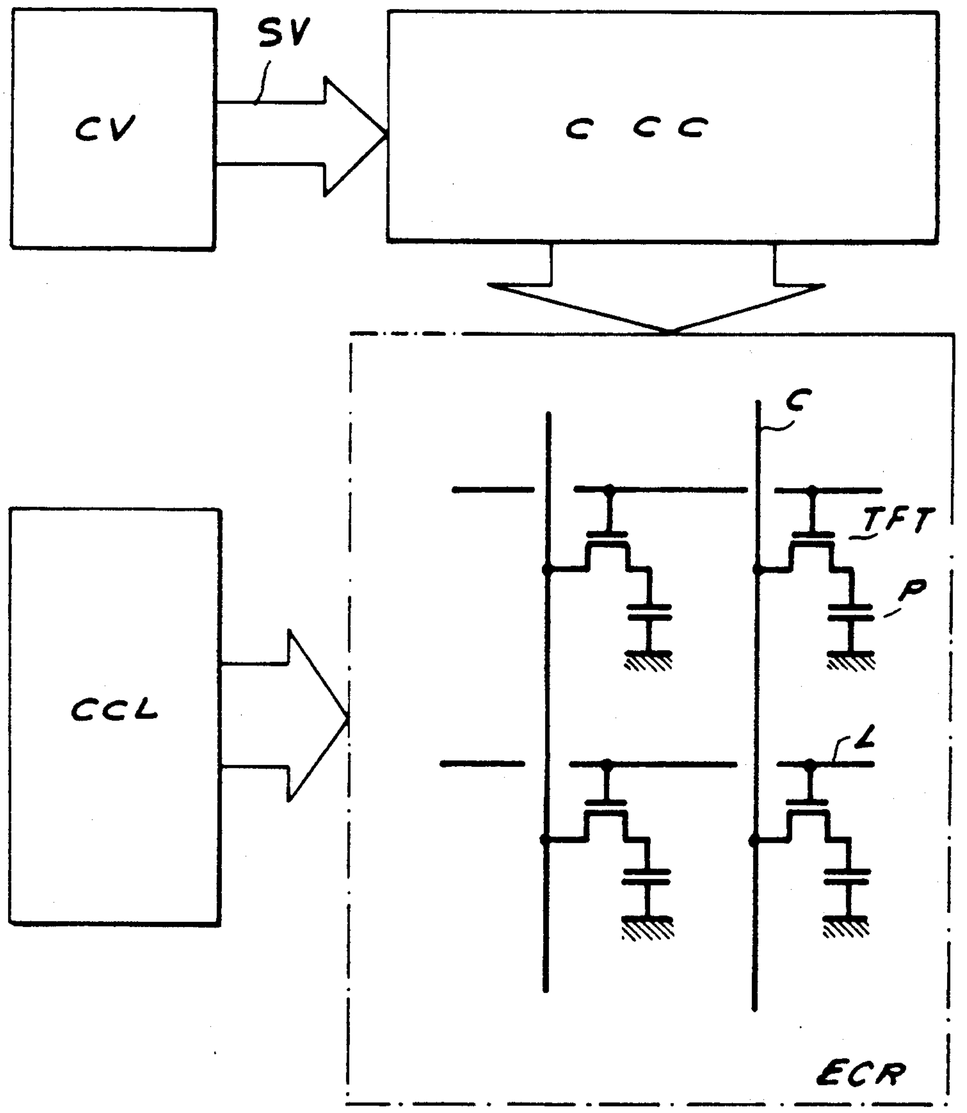
FIG. 1, already described, diagrammatically illustrates the structure of a liquid crystal display screen.
Figure 2:
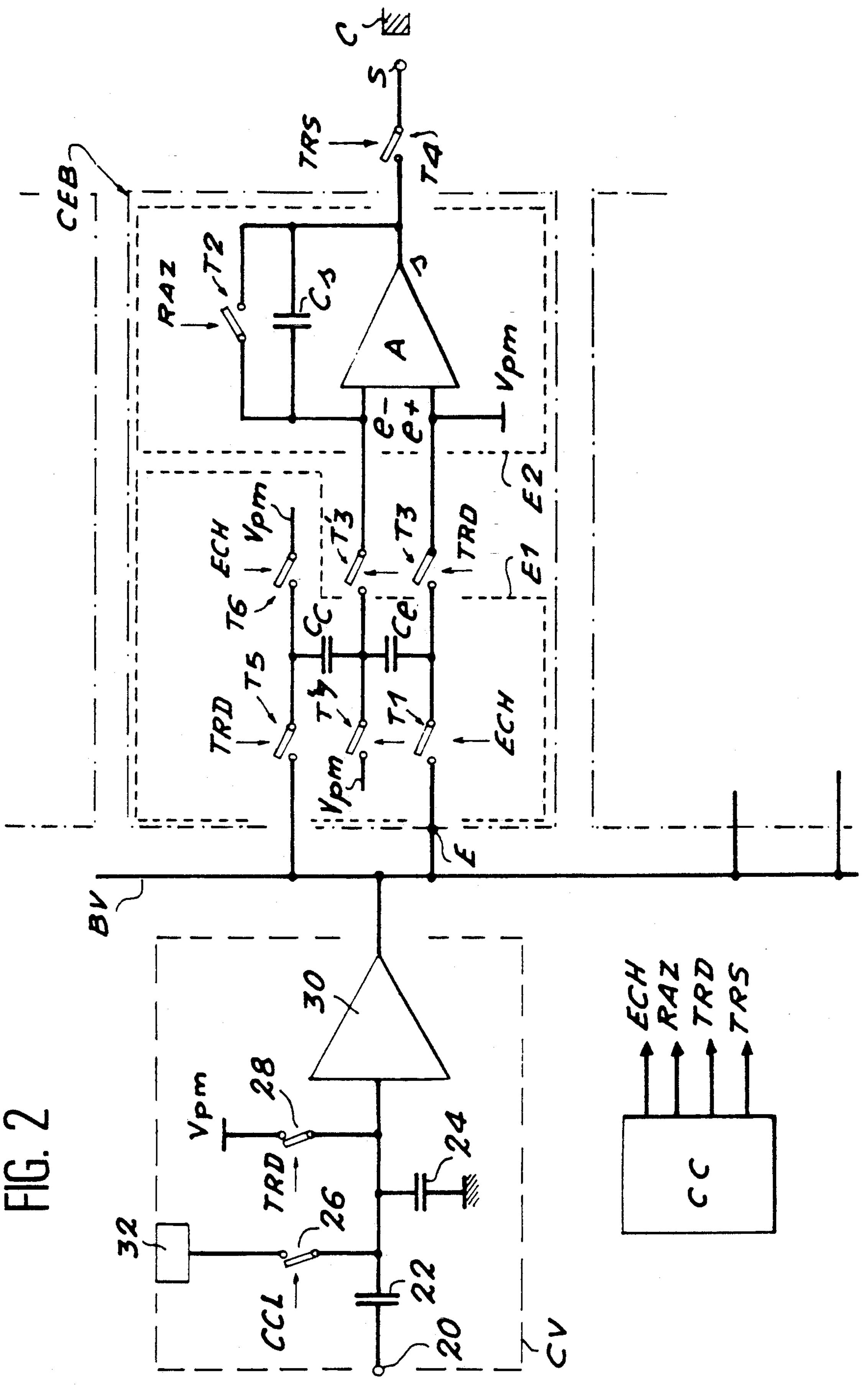
FIG. 2 shows the diagram of a sample and hold circuit according to the invention.

In FIG. 2, a sample and hold circuit CEB with a general input E and a general output S is seen. Input E is connected to a video bus BV connected to a video circuit CV. Output S is connected to a column C. There are as many circuits CEB as they are columns for an overall control circuit.

Video circuit CV is not part of the invention. It is sufficient to indicate briefly that it comprises a video input 20, capacitors 22, 24, a "clamping" (leveling) switch 26, controlled by a signal CCL, a transfer switch 28, controlled by a transfer signal TRD, a shaping amplifier 30 and a framing circuit 32.

Sample and hold circuit CEB, which relates more especially to the invention, as represented, comprises:

a first sampling capacitor Ce connected to input E through two first electronic switches T1, T'1 controlled by a sampling signal ECH, an amplifier A with a nonreversing input $e^+$, a reversing input $e^-$ and an output s, output s being looped on nonreversing input $e^+$ by a second storage capacitor Cs, with a second electronic switch T2 connected in parallel to Cs, this second switch T2 being controlled by a reset signal RAZ; the inputs of amplifier A are further connected to first sampling capacitor Ce by two third electronic switches T3, T'3, these third switches being controlled by a transfer signal TRD.

The circuit can further comprise, but not necessarily, a fourth electronic output switch T4 connected to output s of amplifier A and controlled by a signal TRS.

A general control circuit CC delivers control signals ECH, TRD, TRS, RAZ for the various switches of the sample and hold circuits.

Figure 3:
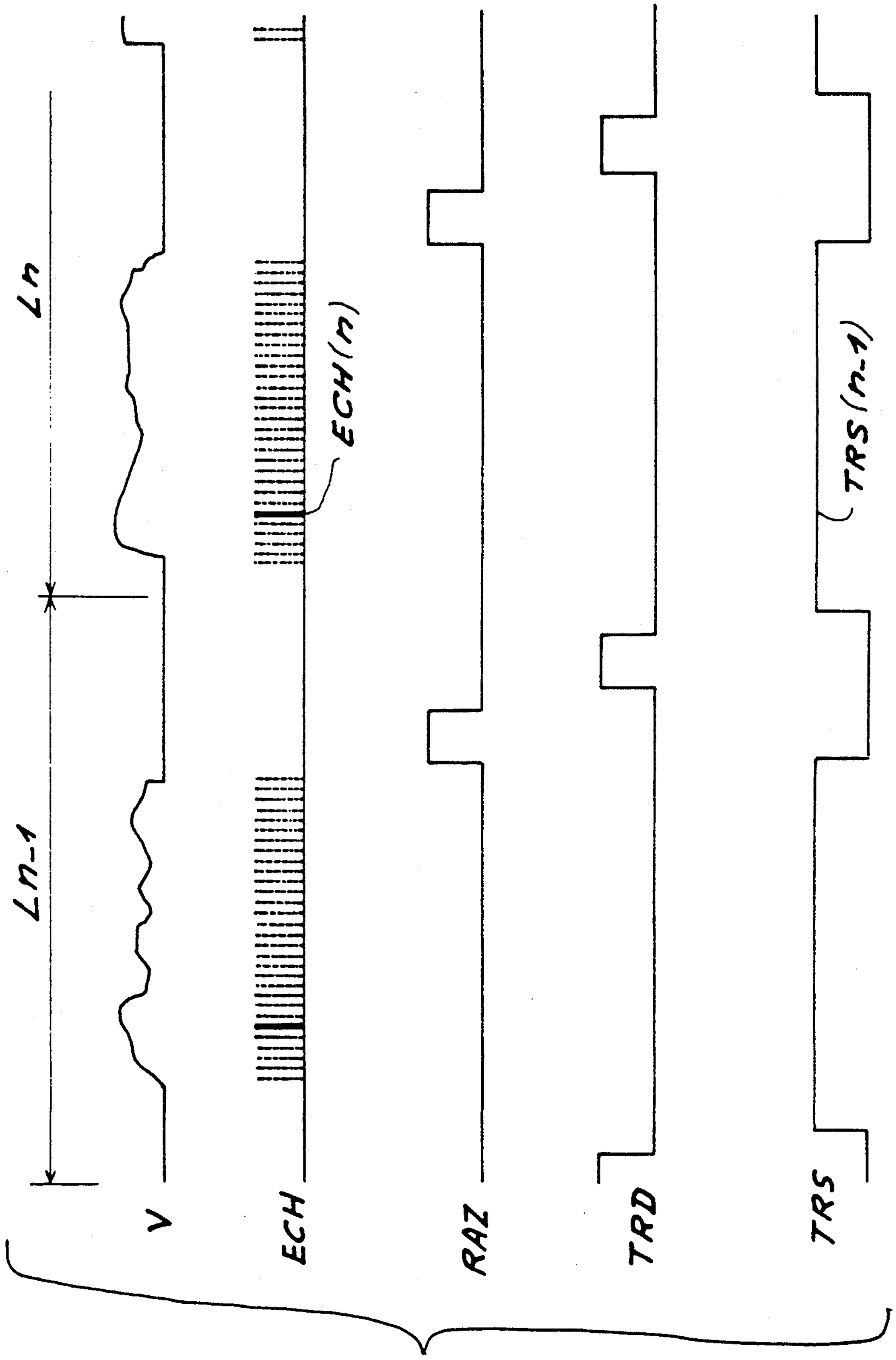
FIG. 3 is a timing diagram showing various control signals appearing in the circuit.

The operation of this circuit can be better understood in light of the timing diagram of FIG. 3. Video signal V (two successive lines Ln−1 and Ln are illustrated, of row n−1 and n) is represented on the first line. The second line shows sampling signal ECH (one pulse corresponds to one sample and hold circuit, the others to the other circuits of the screen); the third line shows reset signal RAZ; transfer signal TRD is represented on the fourth line and transfer signal TRS on the last line.

The operation of the circuit is as follows.

Sampling signal ECH first of all acts on first switches T1, T'1 and causes the loading of first sampling capacitor Ce. During this time, transfer signal TRS is at high level and acts on fourth output switch T4 and makes it possible for the voltage previously held in storage capacitor Cs of amplifier A to be transferred to general output S. Then, reset signal RAZ acts on second switch T2 to reset the voltage held in storage capacitor Cs of amplifier A, while signal TRS is set at zero to uncouple the output of amplifier A from general output S. Signal TRD acting on third switches T3, T'3 causes the transfer of the voltage sampled in first sampling capacitor Ce to amplifier A and its storage capacitor Cs.

It is therefore seen that the sampling of line n (ECHn) occurs during the holding of the sample relative to line n−1 (TRS(n−1)).

Returning to FIG. 2, it is seen that the circuit further comprises an additional capacitor Cc which makes possible an offset correction. This capacitor has a plate connected to input E through a fifth electronic switch T5 controlled by transfer signal TRD and to a point brought to the average voltage of polarization voltages Vpm through a sixth electronic switch T6. Voltage Vpm represents the average between the two end polarization voltages $V_{SS}$ and $V_{DD}$. Correction capacitor Cc has another plate connected to sampling capacitor Ce.

In connection with switch 28 of video circuit CV, the operation of these corrective means is then as follows. Switch 28 and its transfer signal TRD are used for compensation of the offset (at least in the production of the video part with "clamping" system). The compensation of the offset relates to the offset of the video chain. With the device of switch 28, this offset is inserted in the video buses at the same time that samples are transferred to the output of the control circuits (during TRD). The transfer is therefore performed by two paths: by capacitor $C_c$ which transfers the reverse of the offset to $C_s$, and also by $C_e$, which transfers the sample of the signal, not compensated by the offset, in a nonreversed way to $C_s$. The resulting output is the sampled value with a compensation of the offset.

This is possible if, during TRD, VPM is presented at the input of the video amplifiers. In the case of the produced circuit, a clamping circuit is used to bring the video signal to a suitable level and it is forced to VPM during TRD with switch 28. Other ways of obtaining this result are also possible.

Figure 4:
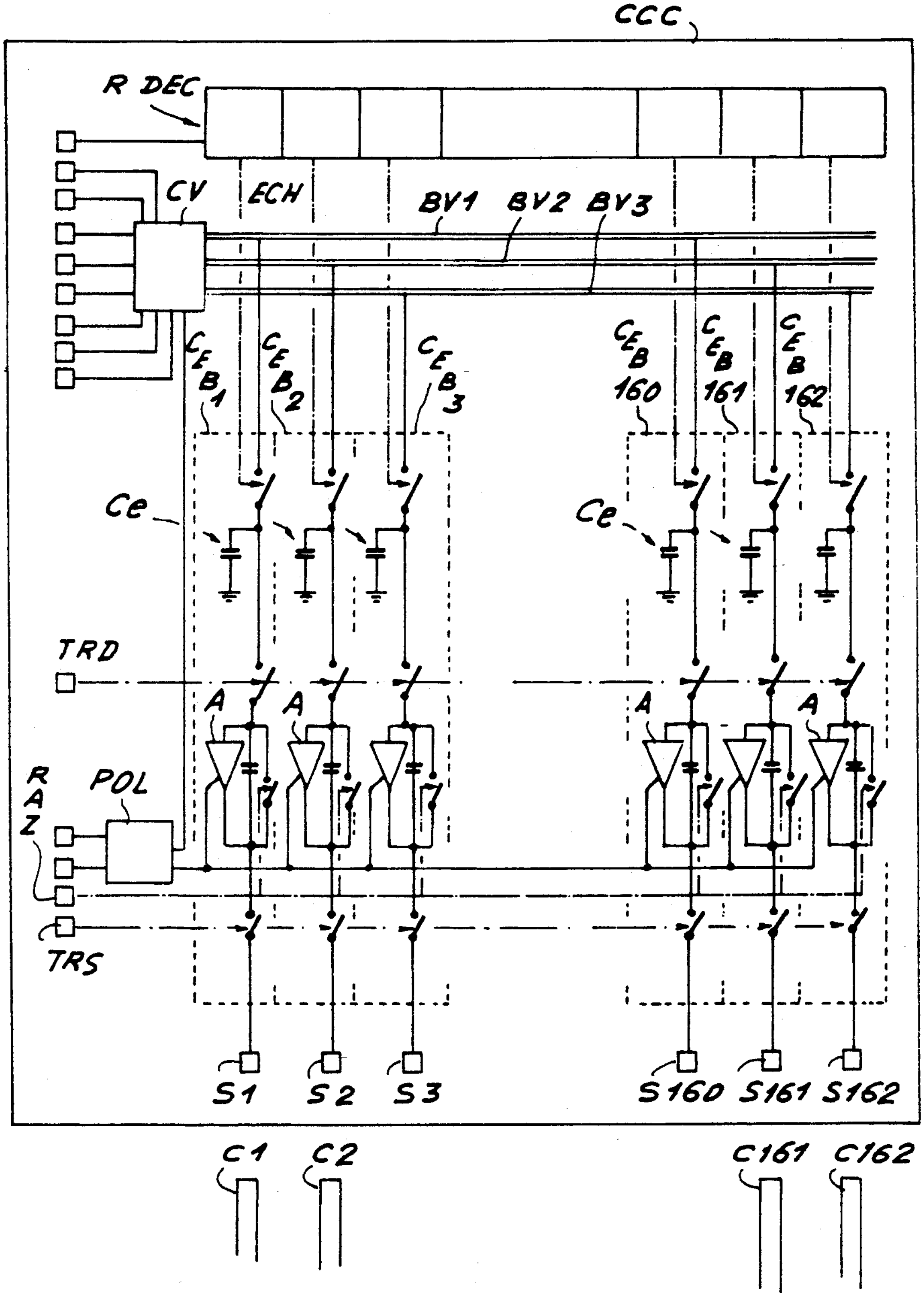
FIG. 4 is a comprehensive simplified diagram of a complete column control circuit. For reasons of clarity, the offset compensation is not represented there.

FIG. 4 illustrates the assembly of multiple sample and hold circuits similar to the one which was just described, in a circuit for control of the columns of a display screen with 162 columns. Global circuit CCC comprises 162 sample and hold circuits CEB1, CEB2, . . . , CEB162 with 162 output pins S1, S2, . . . , S162 connected to 162 columns, C1, C2, . . . , C162. A video circuit CV supplies three video buses BV1, BV2, BV3 corresponding to three red, green, blue primaries. A shift register R DEC with 162 cells delivers 162 sampling signals ECH for the 162 sample and hold circuits CEB1, . . . , CEB162. A polarization source POL supplies video circuit CV and amplifiers A of the sample and hold circuits.

Various pins TRD, TRS, RAZ (not all represented) correspond to the inputs of control signals.

All the circuits which have just been described can be integrated in "chip" form. The CMOS technology is perfectly suitable for the required circuit integration.

What is claimed as new and desired to be secured by Letters Patent of the United States is:

1. A sample and hold circuit for controlling a liquid crystal display screen, said display screen comprising a plurality of addressing lines and columns so as to be controlled in a line-by-line sequential manner, wherein said sample and hold circuit comprises:

a sampling stage comprising a sampling capacitor and an input terminal for receiving a video signal supplied to one of said addressing lines, said sampling capacitor being connected to said input terminal through a first electronic switch;

a holding stage comprising an output connected to one of said columns of the display screen and further comprising an amplifier with a nonreversing input, a reversing input, and an output, wherein said output is connected to a reversing input through a storage capacitor and a second electronic switch connected in parallel to said storage capacitor, said inputs to the amplifier being connected to said sampling capacitor by a pair of third electronic switches;

means for controlling sampling of a first video signal supplied to a selected one of said addressing lines, said sampling being executed in the sampling stage;

means for controlling holding of a second video signal supplied to an addressing line immediately preceding said selected addressing line, said holding being executed in the holding stage;

means for transferring said sampled first video signal from the sampling stage to the holding stage, wherein the output of said amplifier is connected to a general output terminal through a fourth switch, and said general output terminal is connected to said one of said columns of the display screen; and an offset correction capacitor having a first plate, connected to said input terminal of said sampling stage through a fifth electronic switch controlled by said first transfer control signal, and also connected through a sixth electronic switch to a first point in said sample and hold circuit with a charge potential set to an average of polarization voltages of the source and drain of a transistor which forms said sample and hold circuit, and wherein said offset correction capacitor has a second plate connected to said sampling capacitor and to a second point in said sample and hold circuit through a seventh electronic switch, said second point being set to said average of said polarization voltages, said seventh electronic switch being controlled by said sampling control signal and being used to establish connection with said reversing input of said amplifier through one of said third switches via an element which supplies said average of said polarization voltages to the inputs of said amplifier while said first transfer control signal is being supplied.

2. A sample and hold circuit for controlling a liquid crystal display screen, said display screen comprising a plurality of addressing lines and columns so as to be controlled in a line-by-line sequential manner, wherein said sample and hold circuit comprises:

a sampling stage comprising a sampling capacitor and an input terminal for receiving a video signal supplied to one of said addressing lines, said sampling capacitor being connected to said input terminal through a first electronic switch;

a holding stage comprising an output connected to one of said columns of the display screen and further comprising an amplifier with a nonreversing input, a reversing input, and an output, wherein said output is connected to a reversing input through a storage capacitor and a second electronic switch connected in parallel to said storage capacitor, said inputs to the amplifier being connected to said sampling capacitor by a pair of third electronic switches;

means for controlling sampling of a first video signal supplied to a selected one of said addressing lines, said sampling being executed in the sampling stage;

means for controlling holding of a second video signal supplied to an addressing line immediately preceding said selected addressing line, said holding being executed in the holding stage;

means for transferring said sampled first video signal from the sampling stage to the holding stage, wherein the output of said amplifier is connected to a general output terminal through a fourth switch, and said general output terminal is connected to said one of said columns of the display screen; and means for providing a sampling control signal, a reset control signal, a first transfer control signal for controlling transfer of said sampled first video signal from the sampling stage to the holding stage, and a second transfer control signal for controlling transfer of said second video signal from said holding stage to said general output terminal, said four control signals being supplied to said first, second, third and fourth switches, respectively, wherein said sampling control signal acts on said first switch to cause charging of said sampling capacitor, said reset control signal acts on said second switch to reset a voltage held in said storage capacitor of said amplifier, said first transfer control signal acts on said pair of third switches to cause transfer of the charge held in said sampling capacitor to said amplifier and said storage capacitor, and said second transfer control signal acts on said fourth switch such that the voltage held in said storage capacitor of said amplifier is transferred to said general output terminal;

said sample and hold circuit further comprising an offset correction capacitor having a first plate, connected to said input terminal of said sampling stage through a fifth electronic switch controlled by said first transfer control signal, and also connected through a sixth electronic switch to a first point in said sample and hold circuit with a charge potential set to an average of polarization voltages of the source and drain of a transistor which forms said sample and hold circuit, and wherein said offset correction capacitor has a second plate connected to said sampling capacitor and to a second point in said sample and hold circuit through a seventh electronic switch, said second point being set to said average of said polarization voltages, said seventh electronic switch being controlled by said sampling control signal and being used to establish connection with said reversing input of said amplifier through one of said third switches via an element which supplies said average of said polarization voltages to the inputs of said amplifier while said first transfer control signal is being supplied.

* * * * *